United States Patent
Ueyama et al.

(10) Patent No.: US 8,624,194 B2
(45) Date of Patent: Jan. 7, 2014

(54) RADIATION DETECTING DEVICE AND METHOD OF MANUFACTURING THE SAME

(75) Inventors: Ryoko Ueyama, Kawasaki (JP); Nobuhiro Yasui, Yokohama (JP); Yoshihiro Ohashi, Tokyo (JP); Toru Den, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 92 days.

(21) Appl. No.: 13/439,318

(22) Filed: Apr. 4, 2012

(65) Prior Publication Data
US 2012/0256093 A1    Oct. 11, 2012

(30) Foreign Application Priority Data
Apr. 7, 2011   (JP) .................. 2011-085804

(51) Int. Cl.
*G01T 1/20* (2006.01)

(52) U.S. Cl.
USPC .... 250/366; 250/361 R; 250/362; 250/370.11

(58) Field of Classification Search
USPC ........... 250/361 R, 362, 366, 370.01, 370.11, 250/371
See application file for complete search history.

(56) References Cited

U.S. PATENT DOCUMENTS

2010/0320391 A1* 12/2010 Antonuk .............. 250/366

FOREIGN PATENT DOCUMENTS

JP    7027863 A1    1/1995

* cited by examiner

*Primary Examiner* — Mark R Gaworecki
(74) *Attorney, Agent, or Firm* — Canon USA Inc. IP Division (57) ABSTRACT

A radiation detecting device is manufactured by a method that includes forming a scintillator layer on a substrate carrying a plurality of photodetectors and a plurality of convex patterns each including a plurality of convexities, the plurality of convex patterns coinciding with the respective photodetectors, the scintillator layer being formed in such a manner as to extend over the plurality of convex patterns; and forming a crack in a portion of the scintillator layer that coincides, in a stacking direction, with a gap between adjacent ones of the convex patterns by cooling the substrate carrying the scintillator layer. The plurality of convex patterns satisfy specific conditions.

7 Claims, 8 Drawing Sheets

| | FIRST CONVEX PATTERN | | | | SECOND CONVEX PATTERN | | | | | HEIGHT OF CONVEXITY (h) | AVERAGE DISTANCE BETWEEN CONVEX PATTERNS (D) | d < D < 4.6h (d: LARGER ONE OF d1 AND d2) | CRACK FORMATION | PEELING | MTF |
|---|---|---|---|---|---|---|---|---|---|---|---|---|---|---|---|
| | PITCH (t1) | SIZE (s1) | DISTANCE BETWEEN CONVEXITIES (d1) | 0.6 ≤ (s1/t1) < 0.9 | PITCH (t2) | SIZE (s2) | DISTANCE BETWEEN CONVEXITIES (d2) | 0.6 ≤ (s2/t2) < 0.9 | | | | | | | |
| COMPARATIVE EXAMPLE 1 | 100 | 90 | 10 | ×: 0.9 | 100 | 90 | 10 | ×: 0.9 | | 3 | 10 | ×: 10=10<13.8 | × | YES | — |
| EXAMPLE 1 | 10 | 8 | 2 | ○: 0.8 | 5 | 3 | 2 | ○: 0.6 | | 3 | 5.8 | ○: 2<5.8<13.8 | ○ | NO | IMPROVED |
| EXAMPLE 2 | 10 | 6 | 4 | ○: 0.6 | 5 | 3 | 2 | ○: 0.6 | | 3 | 7.1 | ○: 4<7.1<13.8 | ○ | NO | IMPROVED |
| EXAMPLE 3 | 12.5 | 9 | 3.5 | ○: 0.72 | 7.5 | 6 | 1.5 | ○: 0.8 | | 3 | 7.6 | ○: 3.5<7.6<13.8 | ○ | NO | IMPROVED |
| EXAMPLE 4 | 15 | 10 | 5 | ○: 0.66 | 12.5 | 9 | 3.5 | ○: 0.72 | | 3 | 11.2 | ○: 5<11.2<13.8 | ○ | NO | IMPROVED |
| COMPARATIVE EXAMPLE 2 | — | — | — | — | 15 | 10 | 5 | ○: 0.66 | | 3 | 11 | ○: 5<11<13.8 | × | YES | NOT IMPROVED |
| COMPARATIVE EXAMPLE 3 | 7.5 | 4 | 3.5 | ×: 0.53 | 10 | 3 | 7 | ×: 0.3 | | 3 | 9.6 | ○: 7<9.6<13.8 | × | NO | NOT IMPROVED |
| COMPARATIVE EXAMPLE 4 | 10 | 6 | 4 | ○: 0.6 | 7.5 | 6 | 1.5 | ○: 0.8 | | 3 | 14.6 | ×: 4<14.6>13.8 | × | NO | NOT IMPROVED |
| COMPARATIVE EXAMPLE 5 | 12.5 | 9 | 3.5 | ○: 0.6 | 12.5 | 7 | 5.5 | ○: 0.8 | | 3 | 16.6 | ×: 5.5<16.6>13.8 | × | NO | NOT IMPROVED |
| COMPARATIVE EXAMPLE 6 | 15 | 10 | 5 | ○: 0.66 | 10 | 7.5 | 2.5 | ○: 0.75 | | 3 | 30.1 | ×: 5<30.1>13.8 | × | NO | NOT IMPROVED |
| EXAMPLE 5 | 10 | 8 | 2 | ○: 0.8 | 5 | 3 | 2 | ○: 0.6 | | 3 | 5.8 | ○: 2<5.8<13.8 | ○ | NO | IMPROVED |
| EXAMPLE 6 | 10 | 6 | 4 | ○: 0.6 | 5 | 3 | 2 | ○: 0.6 | | 3 | 7.1 | ×: 4<7.1<13.8 | ○ | NO | IMPROVED |

○: GOOD    ×: NO GOOD

RADIATION DETECTING DEVICE AND METHOD OF MANUFACTURING THE SAME

BACKGROUND OF THE INVENTION

1. Field of the Invention

The present invention relates to a radiation detecting device including a scintillator and a method of manufacturing the same.

2. Description of the Related Art

A radiation detecting device, such as a flat panel detector (FPD) used in X-ray imaging performed in the medical practice or the like, includes a scintillator that receives X-rays transmitted through an object and photodetectors that detect light emitted from the scintillator. Thus, the radiation detecting device indirectly detects radiation such as X-rays. An image sensor included in such a radiation detecting device includes a plurality of pixels arranged in a two-dimensional matrix, for example, 2600×2600 pixels. If light emitted from the scintillator diffuses over a plurality of pixels, so-called crosstalk occurs and the accuracy of the resultant image is reduced. To avoid this, there is a known technique in which the scintillator is divided into separate portions provided in correspondence with the pixels, and light is confined within each portion of the scintillator by utilizing total reflection of light caused by the difference in refractive index between the scintillator and air at the boundaries between pixels, whereby the occurrence of crosstalk is reduced or suppressed. An example of such a technique is disclosed by Japanese Patent Application Laid-Open No. 7-027863. Specifically, convexities or concavities are formed on a substrate, on which a scintillator is to be formed, at respective portions corresponding to the boundaries between pixels. Subsequently, a scintillator is formed over the convexities or concavities. Then, the resultant substrate is cooled, so that cracks are formed in the scintillator along the convexities or concavities. Thus, the scintillator is divided into separate portions provided in correspondence with the pixels.

However, the technique disclosed by Japanese Patent Laid-Open No. 7-027863 has another problem in a case where pixels are arranged in a fine pattern, for example, at a pitch of 100 μm and with a distance between pixels of 10 μm, and the convexities or concavities are formed only in portions corresponding to the boundaries between pixels, i.e., portions where cracks are to be formed. In such a case, while a scintillator material having deposited on the substrate is being cooled so that cracks are formed in the resultant scintillator along with the contraction of the scintillator material, the stress occurring between the scintillator material and the substrate increases, increasing the probability that the scintillator may peel off of the substrate.

SUMMARY OF THE INVENTION

According to a first aspect of the present invention, there is provided a method of manufacturing a radiation detecting device including a plurality of photodetectors and a scintillator layer provided above the plurality of photodetectors. The method includes forming a scintillator layer on a substrate carrying a plurality of photodetectors and a plurality of convex patterns each including a plurality of convexities, the plurality of convex patterns coinciding with the respective photodetectors in a stacking direction, the scintillator layer being formed in such a manner as to extend over the plurality of convex patterns; and forming a crack in a portion of the scintillator layer that coincides, in the stacking direction, with a gap between adjacent ones of the convex patterns by cooling the substrate carrying the scintillator layer. The plurality of convex patterns satisfy the following conditions:

$$0.6 \leq s/t < 0.9$$

$$d < D < 4.6h$$

where t denotes a pitch of the convexities in each convex pattern, s denotes a length of an area of each convexity that is in contact with the scintillator layer in each convex pattern, h denotes a height of each convexity in each convex pattern, d denotes a distance between adjacent ones of the convexities in each convex pattern, and D denotes an average distance between adjacent ones of the convex patterns.

According to a second aspect of the present invention, there is provided a method of manufacturing a radiation detecting device including a plurality of photodetectors and a scintillator layer provided above the plurality of photodetectors. The method includes forming a scintillator layer on a substrate carrying a plurality of convex patterns each including a plurality of convexities such that the scintillator layer extends over the plurality of convex patterns; forming a crack in a portion of the scintillator layer that coincides, in a stacking direction, with a gap between adjacent ones of the convex patterns by cooling the substrate carrying the scintillator layer; and arranging the substrate carrying the scintillator layer having the crack such that the substrate face a plurality of photodetectors and the crack coincides with a gap between adjacent ones of the photodetectors. The plurality of convex patterns satisfy the following conditions:

$$0.6 \leq s/t < 0.9$$

$$d < D < 4.6h$$

where t denotes a pitch of the convexities in each convex pattern, s denotes a length of an area of each convexity that is in contact with the scintillator layer in each convex pattern, h denotes a height of each convexity in each convex pattern, d denotes a distance between adjacent ones of the convexities in each convex pattern, and D denotes an average distance between adjacent ones of the convex patterns.

According to a third aspect of the present invention, there is provided a radiation detecting device including a plurality of photodetectors, a plurality of convex patterns each including a plurality of convexities, and a scintillator layer extending over the plurality of convex patterns. The plurality of convex patterns coincide with the respective photodetectors in a stacking direction. The scintillator layer has a crack in a portion thereof that coincides, in a stacking direction, with a gap between adjacent ones of the convex patterns. The radiation detecting device satisfies the following conditions:

$$0.6 \leq s/t < 0.9$$

$$d < D < 4.6h$$

where t denotes a pitch of the convexities in each convex pattern, s denotes a length of an area of each convexity that is in contact with the scintillator layer in each convex pattern, h denotes a height of each convexity in each convex pattern, d denotes a distance between adjacent ones of the convexities in each convex pattern, and D denotes an average distance between adjacent ones of the convex patterns.

In the method of manufacturing a radiation detecting device and the radiation detecting device according to the above aspects of the present invention, crosstalk can be reduced by a simple method, and the occurrence of peeling of the scintillator layer can be suppressed.

Further features of the present invention will become apparent from the following description of exemplary embodiments with reference to the attached drawings.

DESCRIPTION OF THE EMBODIMENTS

Radiation detecting devices and methods of manufacturing the same according to embodiments of the present invention will now be described.

Figure 1A:
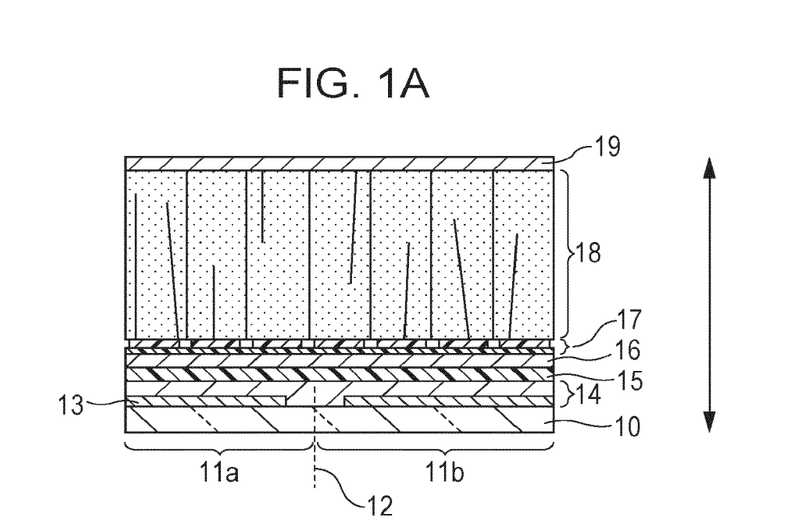
FIGS. 1A and 1B are sectional views of exemplary radiation detecting devices according to embodiments of the present invention.
Figure 1B:
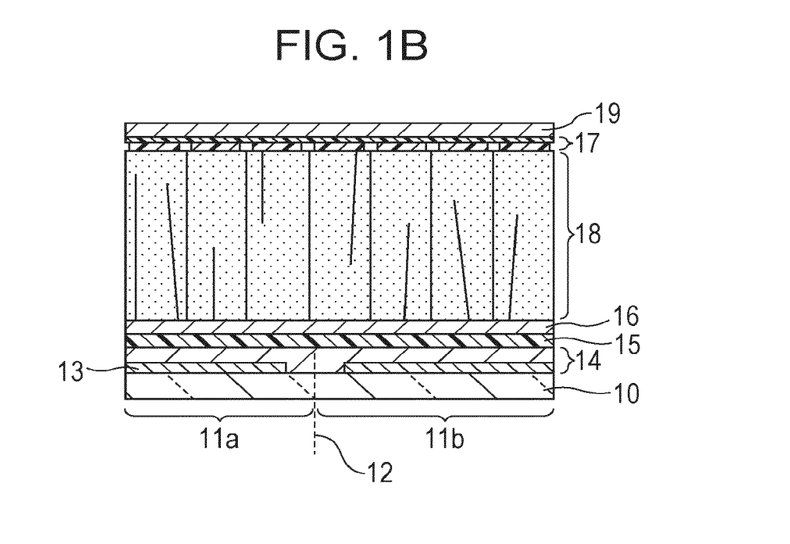

FIGS. 1A and 1B are schematic sectional views of exemplary radiation detecting devices according to embodiments of the present invention.

As illustrated in FIGS. 1A and 1B, the radiation detecting devices according to the embodiments each include a photodetector layer 14 including a plurality of photodetectors 13 and a scintillator layer 18 provided above the photodetector layer 14. Each of the radiation detecting devices illustrated in FIGS. 1A and 1B may also include a protective layer 15 provided between the scintillator layer 18 and the photodetector layer 14, and a reflective layer 19 provided above the scintillator layer 18. The protective layer 15 mechanically and electrically protects the photodetectors 13. The reflective layer 19 increases the factor of utilization of light emitted from the scintillator layer 18. The radiation detecting devices differ from each other in that the device illustrated in FIG. 1A includes a convex pattern layer 17 between the scintillator layer 18 and the photodetector layer 14, whereas the device illustrated in FIG. 1B includes the convex pattern layer 17 between the scintillator layer 18 and the reflective layer 19. The convex pattern layer 17 includes a plurality of convex patterns each including a plurality of convexities. As used herein, the term "convexities" refers to 3-dimensional microstructures (micron-sized structures) having an outward surface. Incidentally, the term "convex pattern" refers to a substantially planar distribution of convexities arranged two-dimensionally in predetermined patterns, such as a honeycomb or the like, as described further below.

The double arrow illustrated in FIG. 1A represents a direction in which the layers are stacked (hereinafter referred to as stacking direction). In each device, the scintillator layer 18 has cracks extending in the stacking direction. The convex patterns will be described in detail separately below with reference to FIGS. 2A to 2C together with a method of manufacturing a radiation detecting device according to an embodiment of the present invention.

Figure 2A:
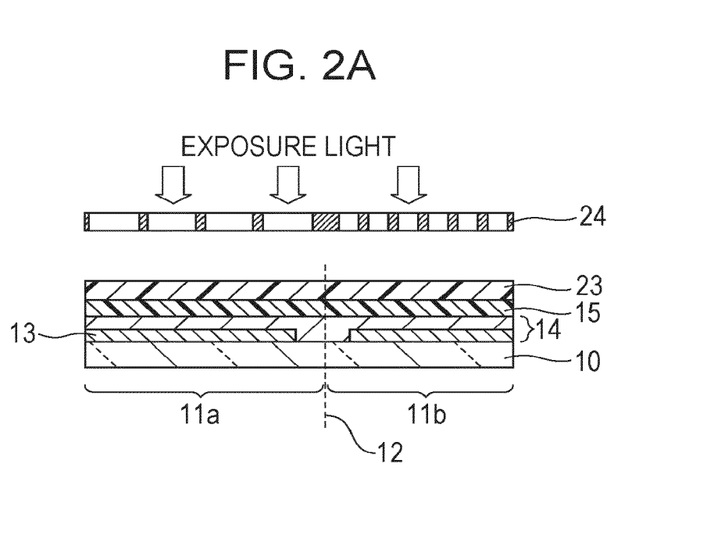
FIGS. 2A to 2C illustrate steps of manufacturing a radiation detecting device according to an embodiment of the present invention.
Figure 2B:
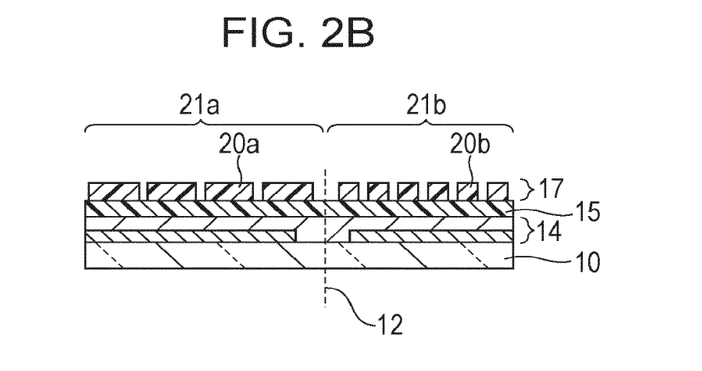
Figure 2C:
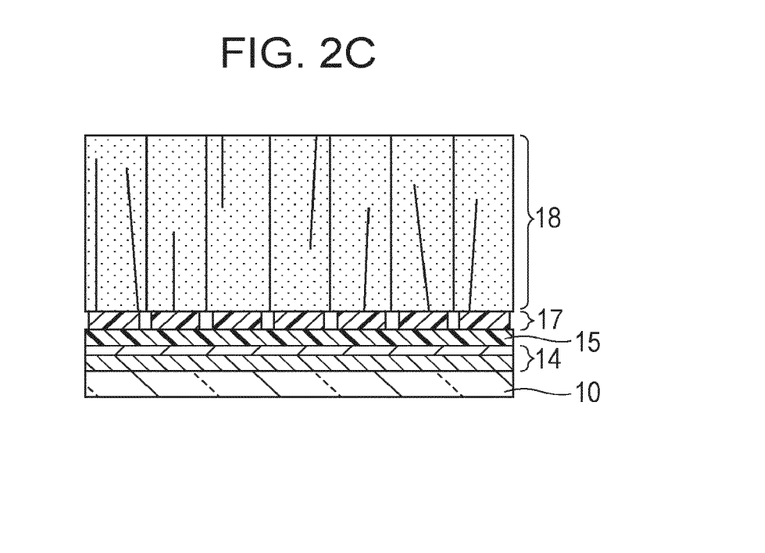
Figure 3A:
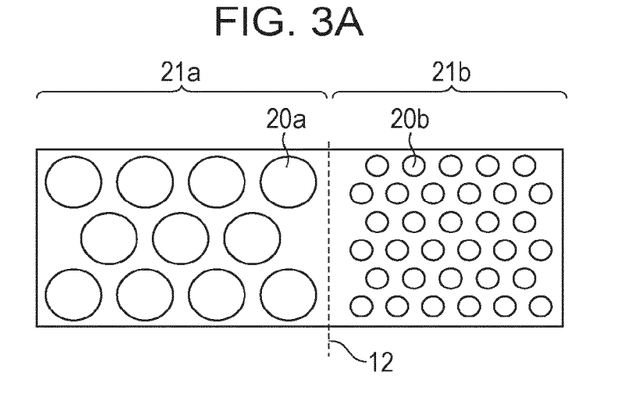
FIGS. 3A to 3C illustrate a distribution of convex patterns according to embodiments of the present invention.
Figure 3B:
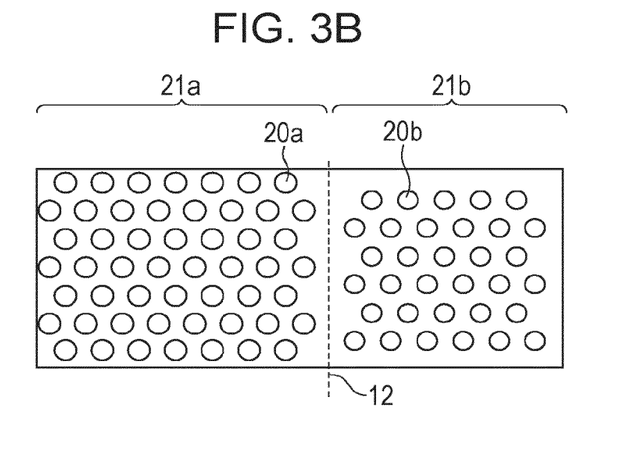
Figure 3C:
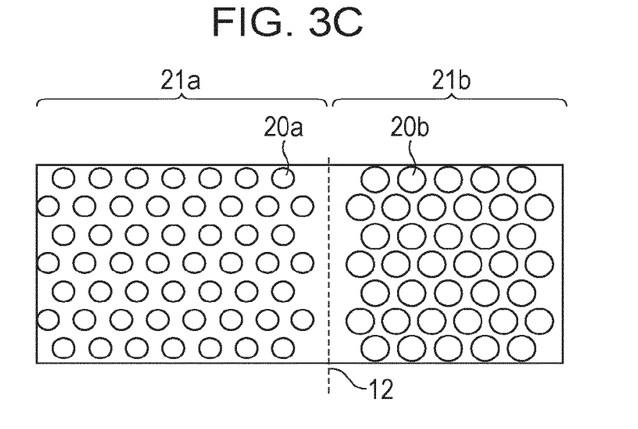
Figure 5A:
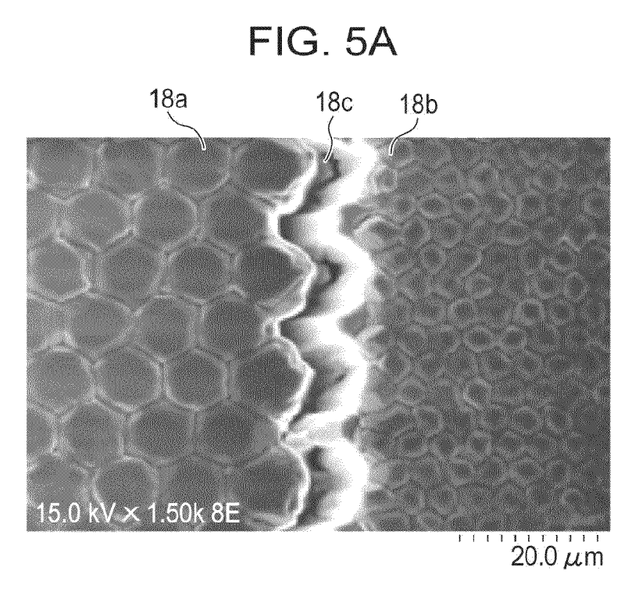
FIGS. 5A and 5B are a top view and a sectional view, respectively, of a radiation detecting device according to an embodiment of the present invention.
Figure 5B:
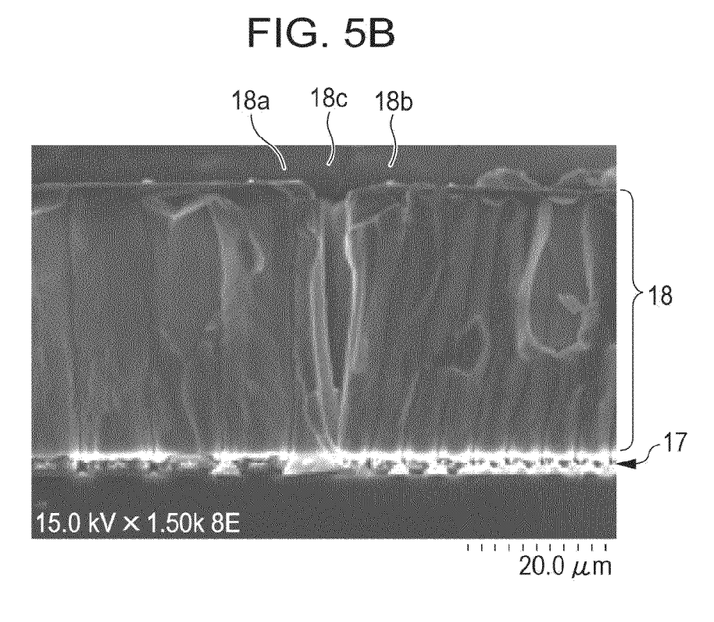

FIGS. 2A and 2B illustrate steps of manufacturing a substrate carrying a photodetector layer 14 including a plurality of photodetectors 13 and a convex pattern layer 17 including a plurality of convex patterns 21 each including a plurality of convexities 20, the convex patterns 21 coincide with the respective photodetectors 13 in the stacking direction. Specifically, referring to FIG. 2A, a resist 23 is provided over a substrate 10 carrying a photodetector layer 14 including a plurality of photodetectors 13. Here, a protective layer 15 may be interposed between the resist 23 and the photodetector layer 14. Subsequently, the resist 23 is exposed to light through a mask 24 and is then developed. Thus, referring now to FIG. 2B, a plurality of convex patterns 21a and 21b each including a plurality of convexities 20a and 20b respectively are provided. Adjacent ones of the convex patterns 21a and 21b have different designs of convexities 20a and 20b, as illustrated in FIG. 2B and described in detail below. Therefore, in FIG. 2B, adjacent convex patterns 21 are denoted by reference numerals 21a and 21b, respectively. When there is no need to distinguish between the convex pattern 21a and the convex pattern 21b, both are hereinafter generally referred to as convex patterns 21. Other members may also be generally denoted without the suffixes a or b of respective reference numerals thereof. In accordance with the above steps, several types of substrates 10 each having a plurality of convex patterns 21 that are arranged in such a manner as to coincide with the respective photodetectors 13 can be obtained. FIGS. 3A to 3C are top views of some substrates 10 each having a plurality of convex patterns 21 manufactured as described above. In each substrate 10, adjacent ones of the convex patterns 21 have different designs of convexities 20. Note that each of the convex patterns 21 is formed of a plurality of convexities 20, and satisfies the below-described conditions provided for the pitch of the convexities 20, the distance between adjacent ones of the convexities 20, the shape (diameter and height) of each convexity 20, and the distance between adjacent ones of the convex patterns 21. Subsequently, referring now to FIG. 2C, a scintillator layer 18 is formed on the resultant convex pattern layer 17 on the substrate 10 in such a manner as to extend over the plurality of convex patterns 21. Subsequently, the substrate 10 now carrying the scintillator layer 18 is cooled, whereby a crack is formed in a portion of the scintillator layer 18 that coincides, in the stacking direction, with a gap between adjacent ones of the convex patterns 21. FIGS. 5A and 5B are a top view and a sectional view, respectively, illustrating part of the scintillator layer 18 having the crack. In FIGS. 5A and 5B, portions 18a and 18b of the scintillator layer 18 coincide with the convex patterns 21a and 21b, respectively, that are adjacent to each other, and a portion 18c of the scintillator layer 18 forms the crack that coincides, in the stacking direction, with the gap between adjacent ones of the convex patterns 21. The radiation detecting device manufactured as described above solves the problem of peeling of the scintillator layer occurring in the related-art radiation detecting device. Moreover, the radiation detecting device manufactured as described above has less crosstalk. These effects will be described in detail below.

Figure 4A:
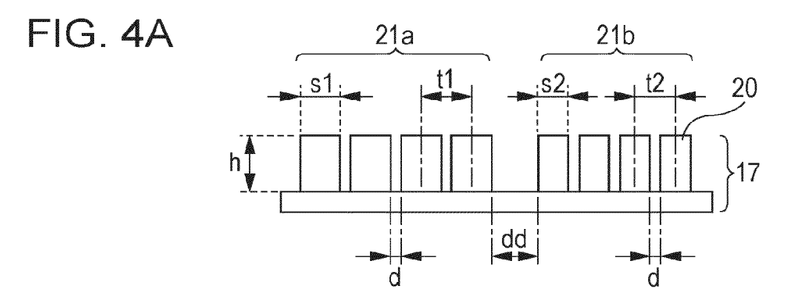
FIGS. 4A to 4C illustrate exemplary shapes and patterns of convexities according to embodiments of the present invention.
Figure 4B:
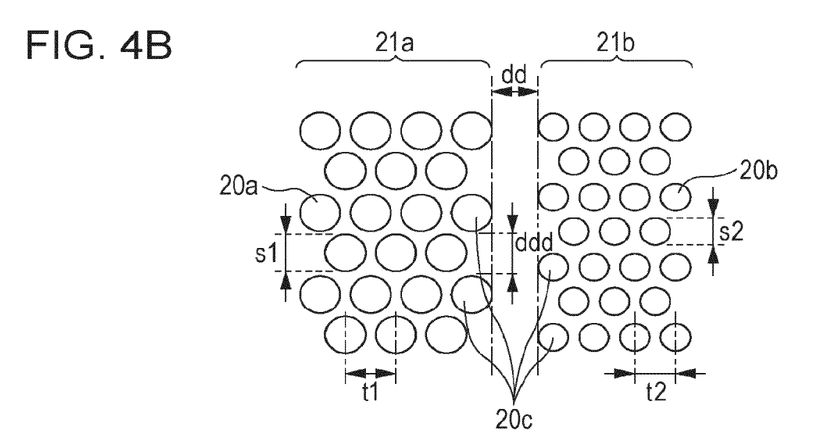
Figure 4C:
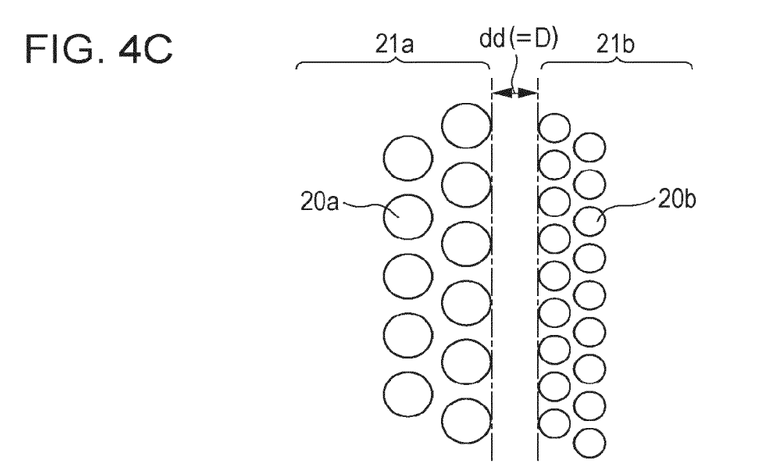

The convex patterns 21 according to the embodiments will now be described with reference to FIGS. 4A to 4C. The convex patterns 21 satisfy conditions $0.6 \leq s/t < 0.9$ (Expression 1) and $d < D < 4.6h$ (Expression 2), where t denotes the pitch of the convexities 20, s denotes the size (diameter) of the top surface of each convexity 20 in each convex pattern 21 that is in contact with the scintillator layer 18 (hereinafter also referred to as top size), h denotes the height of each convexity 20, d denotes the distance between adjacent ones of the convexities 20 in each convex pattern 21, and D denotes the average distance between adjacent ones of the convex patterns 21, as illustrated in FIGS. 4A to 4C and 7A to 7C. The average distance D illustrated in FIGS. 7A to 7C will be described in detail separately below. In the embodiments, Expressions 1 and 2 are satisfied, whereby the crack is formed in the portion of the scintillator layer 18, which extends over the plurality of convex patterns 21, coinciding in the stacking direction with the gap between adjacent ones of the convex patterns 21. Thus, any cracks are prevented from being formed in other portions of the scintillator layer 18 that coincide with the respective convex patterns 21 in the stacking direction. Furthermore, since no cracks are formed in the portions of the scintillator layer 18 coinciding with the respective convex patterns 21, each of the convex patterns 21 and the scintillator layer 18 are in close contact with each other. Consequently, the scintillator layer 18 is prevented from peeling off the convex patterns 21. More specifically, as a result of our diligent study, it has been found that satisfying Expression 1 prevents both formation of any cracks in the portions of the scintillator layer 18 coinciding with the respective convex patterns 21 and peeling of the scintillator layer 18. This is because of the following reasons. If $0.6 \leq s/t$ is satisfied, the distance between adjacent ones of the convexities 20 in each convex pattern 21 is suppressed to a small value relative to the top size of each convexity 20. This prevents the formation of any cracks in a portion of the scintillator layer 18 coinciding with a gap between adjacent ones of the convexities 20 in each convex pattern 21. Furthermore, if $s/t<0.9$ is satisfied, the distance between adjacent ones of the convexities 20 in each convex pattern 21 does not become too small relative to the top size of each convexity 20. Therefore, the stress occurring in portions of the scintillator layer 18 that are in contact with the top surfaces of the convexities 20 is reduced. Consequently, peeling of the scintillator layer 18 is prevented. The relationship of $s/t$ is more preferably $0.6 \leq s/t \leq 0.8$. It has also been found that satisfying Expression 2 forms a crack in the portion of the scintillator layer 18 coinciding in the stacking direction with the gap between adjacent ones of the convex patterns 21 while preventing the formation of any cracks in the portions of the scintillator layer 18 coinciding in the stacking direction with the respective convex patterns 21. That is, a crack is selectively formed in the portion of the scintillator layer 18 coinciding with the gap between adjacent ones of the convex patterns 21. This is because of the following reasons. If $d<D$ is satisfied, the stress occurring in the portion of the scintillator layer 18 coinciding in the stacking direction with the gap between adjacent ones of the convex patterns 21 becomes larger than the stress occurring in the portion of the scintillator layer 18 coinciding with the gap between adjacent ones of the convexities 20 in each convex pattern 21. Therefore, a crack is selectively formed in the portion of the scintillator layer 18 coinciding in the stacking direction with the gap between adjacent ones of the convex patterns 21. Furthermore, if $D<4.6h$ is satisfied, the scintillator layer 18 is prevented from spreading into, or filling, the gap (a depression) between adjacent ones of the convex patterns 21. Therefore, the crack is formed successfully. More preferably, $d<D<4.6h$ and $1.9h<D<3.8h$ are satisfied. Thus, the manufacturing method according to the embodiments provides a radiation detecting device having less crosstalk and less occurrence of peeling of the scintillator layer. Referring to FIGS. 4A to 4C, if the pitch t of the convexities 20 in each convex pattern 21 and the size (diameter) s of the top surface of each convexity 20 in each convex pattern 21 that is in contact with the scintillator layer 18 differ between the convex patterns 21, the convex patterns 21 need to individually satisfy Expression 1. Similarly, if the height h of each convexity 20 in each convex pattern 21 and the distance d between adjacent ones of the convexities 20 in each convex pattern 21 differ between the convex patterns 21, Expression 2 needs to be satisfied between each convex pattern 21 and another convex pattern 21 adjacent thereto. The size (diameter) s of the top surface of each convexity 20 that is in contact with the scintillator layer 18 refers to the size of the convexity 20 seen from the top. If the top surface of the convexity 20 has a circular shape, the size s corresponds to the diameter. If the top surface of the convexity 20 has a square shape, the size s corresponds to the length of each side. The average distance D between adjacent ones of the convex patterns 21 is calculated as follows. In a case illustrated in FIG. 4C, the average distance D between adjacent ones of the convex patterns 21 corresponds to a distance dd. In a case illustrated in FIG. 4B, if, in each convex pattern 21, a column-direction distance ddd between adjacent ones of convexities 20c that are in a column nearest to an adjacent convex pattern 21 is larger than the top size (diameter) s of each convexity 20, the average distance D is $dd+(\frac{1}{4})t1+(\frac{1}{4})t2$. This will now be described with reference to FIG. 7A.

Figure 7A:
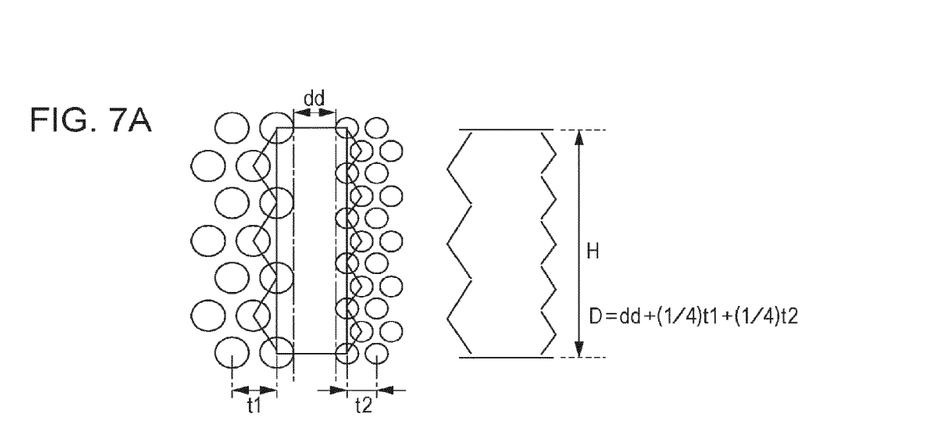
FIGS. 7A to 7C illustrate the average distance between adjacent ones of the convex patterns.
Figure 7B:
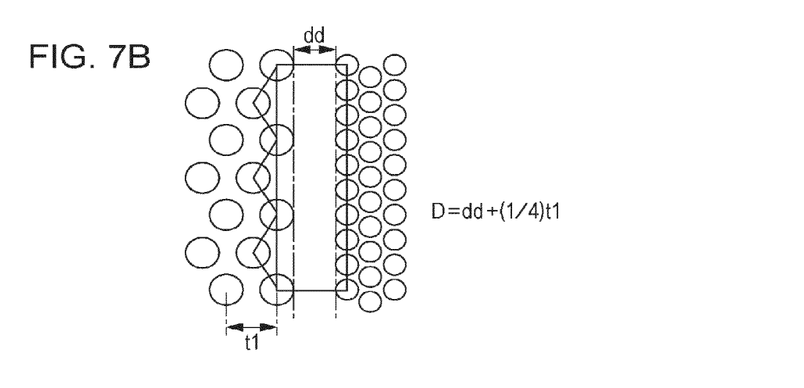
Figure 7C:
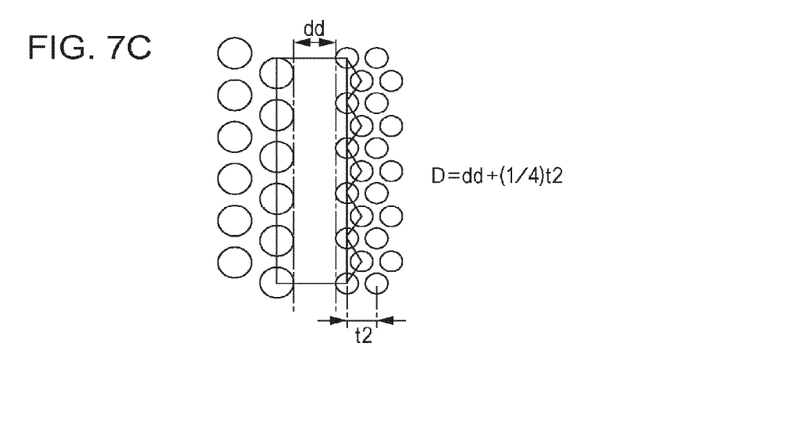

FIG. 7A is an enlarged view of relevant part illustrated in FIG. 4B and includes a diagram illustrating respective portions of adjacent convex patterns 21 and a gap defined therebetween and a diagram illustrating only the gap. In the case illustrated in FIG. 4C, the gap defined between the adjacent convex patterns 21 has a substantially rectangular shape. In the cases illustrated in FIGS. 4B and 7A, the gap defined between the adjacent convex patterns 21 has a shape that is a combination of a rectangle and triangles each having a side length t1 or t2, which corresponds to the pitch of the convexities 20, as illustrated in FIG. 7A. The portion of the scintillator layer 18 coinciding with the gap between adjacent ones of the convex patterns 21 receives a stress corresponding to the area of the gap. In the case illustrated in FIGS. 4B and 7A, when the shape of the gap is converted into a rectangle having the same area while a column-direction length H is unchanged, the length of a side extending in a direction orthogonal to the column direction corresponds to the average distance D between the adjacent convex patterns 21. Similarly, in cases illustrated in FIGS. 7B and 7C, the average distance D is $dd+(\frac{1}{4})t1$ and $dd+(\frac{1}{4})t2$, respectively.

The above description concerns embodiments in which a scintillator layer 18 is formed on a substrate 10 carrying a plurality of photodetectors 13 and a plurality of convex patterns 21 each including a plurality of convexities 20, the plurality of convex patterns 21 coinciding with the respective photodetectors 13 in the stacking direction. The present invention is not limited to such embodiments. For example, in the case illustrated in FIG. 1B, the radiation detecting device may be manufactured as follows. A scintillator layer 18 is formed on a substrate carrying a plurality of convex patterns 21 each including a plurality of convexities 20 such that the scintillator layer 18 extends over the plurality of convex patterns 21. Subsequently, the substrate now carrying the scintillator layer 18 is cooled, whereby a crack is formed in a portion of the scintillator layer 18 coinciding with a gap between adjacent ones of the convex patterns 21. Subsequently, the substrate carrying the scintillator layer 18 having the crack is arranged in such a manner as to face a plurality of photodetectors 13 and such that the crack coincides with a gap between adjacent ones of the photodetectors 13.

The pitch t of the convexities 20 in each convex pattern 21 is preferably 1 μm or larger and 15 μm or smaller. If the pitch t is 1 μm or larger, a sufficient quantity of light emission is obtained. This is because the diffusion lengths of high-energy electrons and holes produced by the radiation entering the radiation detecting device are expected to fall within the foregoing range. If the pitch t is smaller than 1 µm, the quantity of light emission is expected to decrease. If the pitch t is 15 µm or smaller, the area of contact between the scintillator layer 18 and each convexity 20 is prevented from becoming too large. Consequently, the occurrence of peeling of the scintillator layer 18 is suppressed.

The convexities 20 in each convex pattern 21 may be in a honeycomb arrangement. Thus, the portion of the scintillator layer 18 coinciding with each convex pattern 21 is maintained to be in good condition.

The manufacturing method may further include a step of filling the crack with a member that diffuses light. Thus, crosstalk is further reduced.

The manufacturing method may further include a step of covering the crack with a member that reflects light. Thus, crosstalk is further reduced.

The individual members included in the radiation detecting device according to the embodiments will now be described in further detail.

The substrate 10 is made of glass or the like.

The protective layer 15 is made of resin such as polyimide.

An underlayer 16 may be provided so as to protect the photodetectors 13 together with the protective layer 15. If the scintillator layer 18 is made of an alkali halide material such as CsI, the underlayer 16 prevents the degradation of the photodetectors 13 caused by the diffusion or the like of halogen through the protective layer 15 into the photodetectors 13.

The reflective layer 19 increases the factor of utilization of light emitted from the scintillator layer 18. In the case illustrated in FIG. 1B, the convex pattern layer 17 may also function as a reflective layer.

The convex pattern layer 17 including the convexities 20 is made of epoxy resin or the like.

Practically, the radiation detecting device includes many other members, such as thin-film transistors (TFTs) provided for respective pixels 11a and 11b; TFTs are not illustrated. In the embodiments, description and illustration of such members other than the essential members are omitted for ease of description.

In the step of forming convexities 20 illustrated in FIG. 2A, if the resist 23 that is to become the convexities 20 as described above is an epoxy-resin negative photoresist, the thickness and pattern size of the resist 23 are adjustable by adjusting the exposure value and the post-exposure bake time. Portions of the resist 23 that have been exposed to light through the mask 24 having a Cr pattern that is discontinuous at a portion corresponding to a boundary 12 between adjacent ones of pixels (11a and 11b) are subjected to post-exposure bake, whereby cross-linking and fixation progress in those portions of the resist 23 occur. Subsequently, the other portions of the resist 23 that have not been exposed to light are removed with a developer. Thus, a convex pattern layer 17 formed of the portions of the resist 23 that have been exposed to radiative energy is obtained. The size of each pixel (11a or 11b illustrated in FIGS. 1A and 1B) is about 50 µm to about 200 µm.

Referring now to FIGS. 3A to 3C that are top views illustrating different patterns of convexities 20, the convexities 20 are arranged at a pitch smaller than the size of each pixel. FIG. 3A illustrates a case where both the pitch t of the convexities 20 and the top size s of each convexity 20 are different between adjacent ones of the pixels (convex patterns 21). FIG. 3B illustrates a case where both the pitch t of the convexities 20 and the top size s of each convexity 20 are the same between adjacent ones of the pixels (convex patterns 21) but the respective patterns of convexities 20 in the adjacent pixels are staggered from each other. FIG. 3C illustrates a case where one of the pitch t of the convexities 20 and the top size s of each convexity 20 is different between adjacent ones of the pixels (convex patterns 21).

The convexities 20 are not necessarily formed by processing a resist into a certain pattern as described above and may be formed by processing a substrate. For example, a pattern of convexities 20 may be formed by applying a resist onto a substrate made of Si, glass, or a carbon material, processing the resist, and etching the substrate through the resultant resist. Alternatively, an imprint method may be employed considering costs. In any case, the material for the convex pattern layer 17 may be mainly composed of a light element in a periodic table of the elements.

The scintillator layer 18 may be formed by vacuum deposition, which is a practical method that realizes quick film formation. For example, CsI powder and TlI powder are put into respective deposition boats. The boat for CsI and the boat for TlI are heated to 700° C. and 300° C., respectively, and co-deposition is performed. Suppose that while the convexities 20 are heated to a temperature higher than room temperature, for example, 200° C., the co-deposition is performed under an Ar gas pressure of $5 \times 10^{-3}$ Pa, with a Tl content at the emission center of about 1 mol % to about 2 mol %, and with a film thickness of 200 µm. Then, there grows, as the scintillator layer 18, a CsI polycrystalline film in which faces of most grains that are in contact with and are parallel to the top surfaces of the convexities 20 in the convex patterns 21 extend in a (110) plane. Thus, the embodiments employ a CsI film with grains oriented in a [110] direction. Depending on conditions for deposition, a CsI film with grains oriented in another direction such as [200] or a CsI film with a mixture of grains oriented in different directions may grow. In the CsI film according to the embodiments in which grains are oriented in the [110] direction, the grains grown at positions farther from the top surfaces of the convexities 20 in the convex pattern layer 17 in the thickness direction are in surface contact with each other to a greater degree. Hence, the stress occurring in the scintillator layer 18 is larger in upper portions and smaller in lower portions that are in contact with the top surfaces of the convexities 20. Therefore, while the CsI film is retained not to peel from the substrate 10, or the convexities 20, the stress concentrates in each portion of the CsI film coinciding with the boundary 12 between adjacent ones of the pixels (the gap between adjacent ones of the convex patterns 21). Considering the powder intensity ratio used in the X-ray diffractometry (XRD), it is desirable to obtain, through vacuum deposition, a CsI polycrystalline film in which the (110) diffraction peak is the largest among different diffraction peaks, that is, most grains have faces extending in the (110) plane.

When the substrate 10 carrying the scintillator layer 18 is cooled, a crack is formed in the portion of the scintillator layer 18 coinciding with the gap between adjacent ones of the convex patterns 21 (pixels). The crack is formed with a stress applied to the scintillator layer 18 when the substrate is cooled to, for example, room temperature or below. This mechanism is as follows. The portion of the scintillator layer 18 coinciding with the gap between adjacent ones of the convex patterns 21 (the boundary 12 between adjacent ones of the pixels) is vulnerable to the stress as described above. In a case where the convex patterns 21 and the convexities 20 satisfy Expressions 1 and 2, when the scintillator layer 18 formed over the convex patterns 21 contracts with a thermal stress, the scintillator layer 18 cracks from the vulnerable portion.

Figure 8:
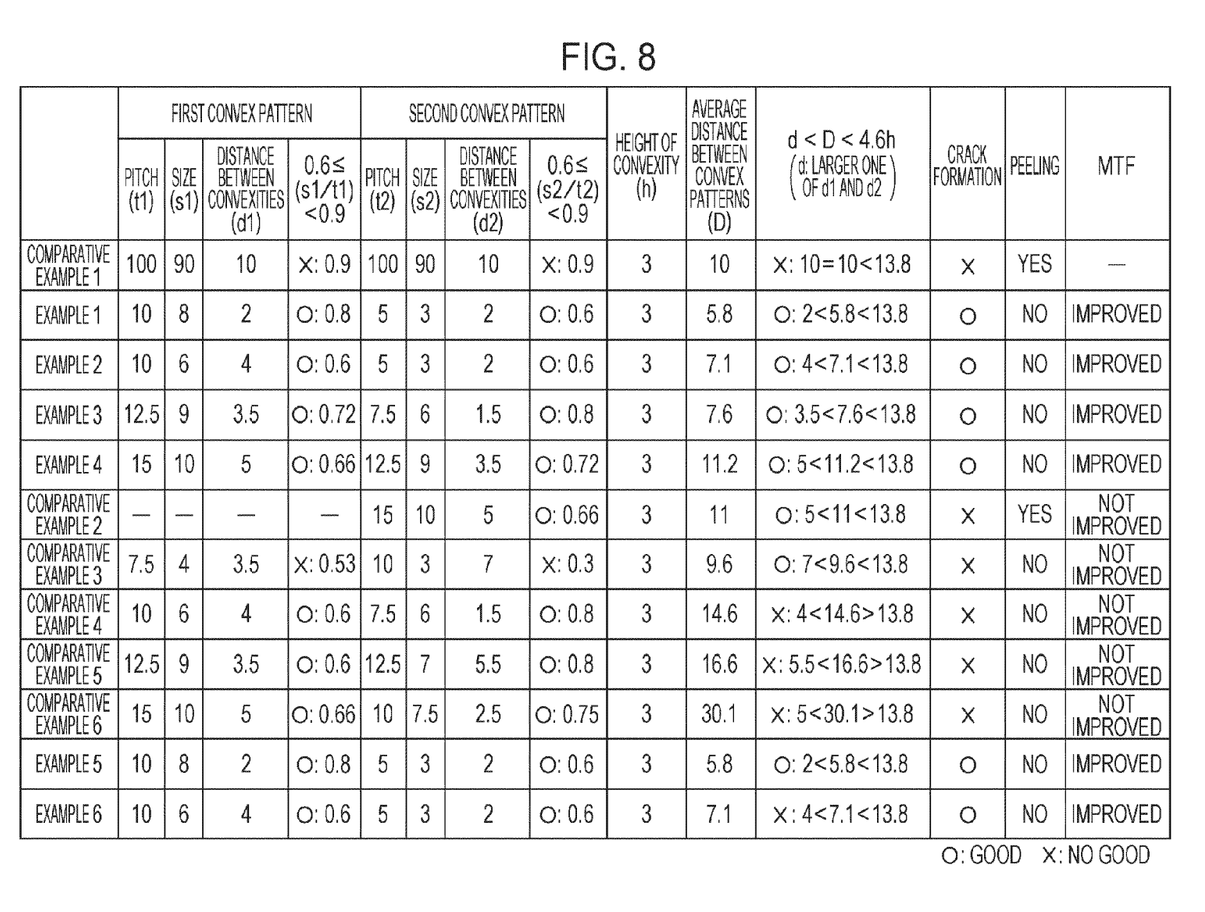
FIG. 8 is a table summarizing data on the examples and the comparative examples.

Embodiments of the present invention have been described above. Now, examples of the present invention will be described. FIG. 8 is a table summarizing examples of the present invention and comparative examples. In the examples and the comparative examples, there were prepared different substrates 10 carrying respective convex pattern layers 17 including convexities 20 arranged in different patterns each being discontinuous at the boundary 12 between adjacent ones of the pixels (convex patterns 21), and a scintillator layer 18 was formed on each of the substrates 10 in such manner as to extend over the adjacent convex patterns 21. Subsequently, the resultant substrates 10 were cooled. Adjacent ones of the convex patterns 21 had different arrangements of convexities 20. Therefore, in the table, the adjacent convex patterns 21 are referred to as a first convex pattern and a second convex pattern, respectively, as a matter of convenience. The table summarizes the status of crack formation at the boundary 12 between the adjacent pixels (the gap between adjacent ones of the convex patterns 21), the occurrence of peeling of the scintillator layer 18, and the modulation transfer function (MTF), i.e., the spatial resolution of the resultant image, realized by the photodetectors 13.

Referring to FIG. 8, the relationship of s/t is defined as $0.6 \leq s/t < 0.9$, or more preferably $0.6 \leq s/t \leq 0.8$. Furthermore, the relationship between d and D is defined as $d<D<4.6h$, or more preferably $1.9h<D<3.8h$. In Example 1 and Example 5, D is 5.8 and satisfies the condition $3*1.9=5.7<D$. In Example 4, D is 11.2 and satisfies the condition $D<3*3.8=11.4$.

Radiation detecting devices according to the examples of the present invention and the comparative examples summarized in FIG. 8 will now be described in detail. First, Comparative Example 1 will be described as a reference for comparison.

COMPARATIVE EXAMPLE 1

Figure 6A:
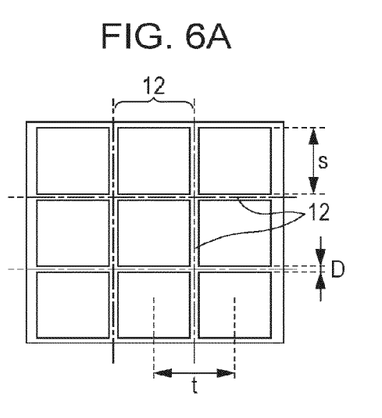
FIGS. 6A to 6F are top views of patterns of convexities according to examples of the present invention and comparative examples.

In accordance with the process of forming a convex pattern layer 17 described above, a plurality of convex patterns 21 were formed on the upper surface of a glass substrate 10 carrying a photodetector layer 14 including photodetectors 13 and a polyimide protective layer 15. Furthermore, in accordance with the process of forming a scintillator layer 18 described above, a CsI film was deposited over the entirety of the substrate 10 in such manner as to extend over the plurality of convex patterns 21. In Comparative Example 1, referring to FIG. 6A, the convex patterns 21 were formed with a pitch of 100 µm, a top size s of each convexity 20 of 90 µm, and a gap between adjacent ones of the convexities 20 of 10 µm and such that the gap was positioned between adjacent ones of the photodetectors 13. That is, each convex pattern 21 included one convexity 20. The scintillator layer 18 was formed by co-deposition in which CsI powder and TlI powder were put into respective deposition boats and the boat for CsI and the boat for TlI were heated to 700° C. and 300° C., respectively. Other parameters for the co-deposition include a substrate temperature of 200° C. and an Ar gas pressure of $5 \times 10^{-3}$ Pa. In Comparative Example 1 in which the convex pattern layer 17 did not include, in each pixel, a pattern of convexities 20 arranged at a pitch smaller than the size of one pixel, that is, each convex pattern 21 only included one convexity 20, neither Expression 1 nor Expression 2 was satisfied. Therefore, when the substrate 10 having the CsI film deposited thereon was cooled to room temperature or below, no crack was formed at the boundary 12 between adjacent ones of the pixels and peeling of the CsI polycrystalline film occurred.

EXAMPLE 1

In accordance with the process of forming a convex pattern layer 17 described in the above embodiments, an epoxy-resin negative photoresist, for example, SU-8, was applied as the resist 23 onto the upper surface of a glass substrate 10 carrying a photodetector layer 14 including photodetectors 13 and a polyimide protective layer 15, and convex patterns 21 including convexities 20 illustrated in FIGS. 4A and 4B were photolithographically formed. When SU-8 is employed as the resist 23, the thickness and pattern size of the resist 23 are adjustable by adjusting the exposure value and the post-exposure bake time. Portions of the resist 23 that had been exposed to light through a mask 24 having a Cr pattern were subjected to post-exposure bake at 65° C. for one minute and at 90° C. for two minutes, whereby cross-linking and fixation progressed in those portions of the resist 23. Subsequently, the other portions of the resist 23 that had not been exposed to light were removed with a developing solution called SU-8 developer. Thus, a convex pattern layer 17 composed of SU-8 was obtained. FIG. 4B illustrates a top view of the convex pattern layer 17. The convex pattern layer 17 was observed through a scanning electron microscope (SEM, S-5500 manufactured by Hitachi). There were formed a first convex pattern (21a) in which the pitch t1 of the convexities 20a was 10 µm, the top size s1 of each convexity 20a was 8 µm, the height h of each convexity 20a was 3 µm, and the distance d1 between adjacent ones of the convexities 20a was 2 µm; and a second convex pattern (21b) in which the pitch t2 of the convexities 20b was 5 µm, the top size s2 of each convexity 20b was 3 µm, the height h of each convexity 20b was 3 µm, and the distance d2 between adjacent ones of the convexities 20b was 2 µm. The average distance D between the first convex pattern and the second convex pattern was 5.8 µm. The gap between the first convex pattern and the second convex pattern, i.e., the gap between adjacent ones of the convex patterns 21, resided between adjacent ones of the photodetectors 13.

Subsequently, a scintillator layer 18 was formed over the first convex pattern and the second convex pattern in the same manner as in Comparative Example 1. After the scintillator layer 18 was formed, the substrate 10 was cooled to room temperature or below, whereby a stress was applied to the scintillator layer 18 and a crack was formed. In this state, peeling was not observed. When the scintillator layer 18 was observed through a scanning electron microscope (SEM, S-5500 manufactured by Hitachi), the scintillator layer 18 was found to include grains that had grown in correspondence with the convexities 20 in the convex pattern layer 17, as illustrated in FIGS. 5A and 5B.

In Example 1, according to the SEM image, the crack was formed in the portion of the scintillator layer 18 coinciding with the boundary 12 between adjacent ones of the pixels, i.e., the gap between adjacent ones of the convex patterns 21. With this crack, crosstalk among pixels was reduced. Consequently, the MTF was improved.

Figure 6B:
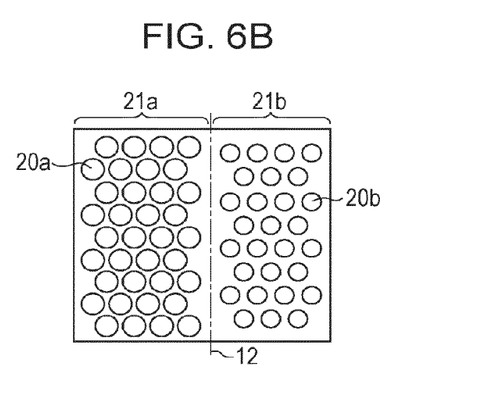
Figure 6C:
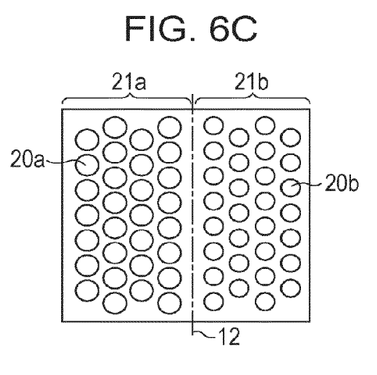

The convex pattern layer 17 in Example 1 included the convexities 20 arranged as illustrated in FIG. 6B, corresponding to FIG. 4B, as a top view of the convex patterns 21. When the convexities 20 were arranged in another way as illustrated in FIG. 6C, the same effect was produced.

EXAMPLE 2

In accordance with the process employed in Example 1, there were formed a first convex pattern (21a) in which the pitch t1 of the convexities 20a was 10 µm, the top size s1 of each convexity 20a was 6 μm, the height h of each convexity 20a was 3 μm, and the distance d1 between adjacent ones of the convexities 20a was 4 μm; and a second convex pattern (21b) in which the pitch t2 of the convexities 20b was 5 μm, the top size s2 of each convexity 20b was 3 μm, the height h of each convexity 20b was 3 μm, and the distance d2 between adjacent ones of the convexities 20b was 2 μm. Thus, a convex pattern layer 17 including the convexities 20 arranged as illustrated in FIG. 6B, the same as in Example 1, was obtained. The average distance D between the first convex pattern and the second convex pattern was 7.1 μm. Subsequently, in accordance with the process of forming a scintillator layer 18 employed in Example 1, CsI was deposited over the convexities 20, and the substrate 10 was cooled to room temperature or below. When the scintillator layer 18 was observed through a scanning electron microscope (SEM, S-5500 manufactured by Hitachi), a crack was observed in a portion of the scintillator layer 18 coinciding with the boundary 12 between adjacent ones of the pixels, i.e., the gap between the first convex pattern and the second convex pattern. Peeling was not observed, as in Example 1. Since crosstalk among pixels was reduced by the crack formed in the portion of the scintillator layer 18 coinciding with the boundary 12 between adjacent ones of the pixels, the MTF was improved.

EXAMPLE 3

In accordance with the process employed in Examples 1 and 2, there were formed a first convex pattern (21a) in which the pitch t1 of the convexities 20a was 12.5 μm, the top size s1 of each convexity 20a was 9 μm, the height h of each convexity 20a was 3 μm, and the distance d1 between adjacent ones of the convexities 20a was 3.5 μm; and a second convex pattern (21b) in which the pitch t2 of the convexities 20b was 7.5 μm, the top size s2 of each convexity 20b was 6 μm, the height h of each convexity 20b was 3 μm, and the distance d2 between adjacent ones of the convexities 20b was 1.5 μm. Thus, a convex pattern layer 17 including convexities 20 arranged as illustrated in FIG. 6B, the same as in Examples 1 and 2, was obtained. The average distance D between the first convex pattern and the second convex pattern was 7.6 μm. Subsequently, in accordance with the process of forming a scintillator layer 18 employed in Examples 1 and 2, CsI was deposited over the convexities 20, and the substrate 10 was cooled to room temperature or below. When the scintillator layer 18 was observed through a scanning electron microscope (SEM, S-5500 manufactured by Hitachi), a crack was observed in a portion of the scintillator layer 18 coinciding with the boundary 12 between adjacent ones of the pixels, i.e., the gap between the first convex pattern and the second convex pattern. Peeling was not observed, as in Examples 1 and 2. Since crosstalk among pixels was reduced by the crack formed in the portion of the scintillator layer 18 coinciding with the boundary 12 between adjacent ones of the pixels, the MTF was improved.

EXAMPLE 4

In accordance with the process employed in Examples 1 to 3, there were formed a first convex pattern (21a) in which the pitch t1 of the convexities 20a was 15 μm, the top size s1 of each convexity 20a was 10 μm, the height h of each convexity 20a was 3 μm, and the distance d1 between adjacent ones of the convexities 20a was 5 μm; and a second convex pattern (21b) in which the pitch t2 of the convexities 20b was 12.5 μm, the top size s2 of each convexity 20b was 9 μm, the height h of each convexity 20b was 3 μm, and the distance d2 between adjacent ones of the convexities 20b was 3.5 μm. Thus, a convex pattern layer 17 including the convexities 20 arranged as illustrated in FIG. 6B, the same as in Examples 1 to 3, was obtained. The average distance D between the first convex pattern and the second convex pattern was 11.2 μm. Subsequently, in accordance with the process of forming a scintillator layer 18 employed in Examples 1 to 3, CsI was deposited over the convexities 20, and the substrate 10 was cooled to room temperature or below. When the scintillator layer 18 was observed through a scanning electron microscope (SEM, S-5500 manufactured by Hitachi), a crack was observed in a portion of the scintillator layer 18 coinciding with the boundary 12 between adjacent ones of the pixels, i.e., the gap between the first convex pattern and the second convex pattern. Peeling was not observed, as in Examples 1 to 3. Since crosstalk among pixels was reduced by the crack formed in the portion of the scintillator layer 18 coinciding with the boundary 12 between adjacent ones of the pixels, the MTF was improved.

COMPARATIVE EXAMPLE 2

Figure 6D:
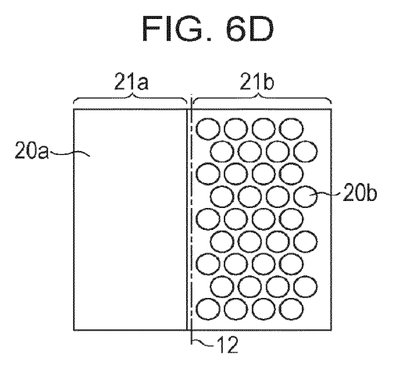

In accordance with the process employed in Examples 1 to 4, there were formed a first convex pattern (21a, as a solid film) including only one convexity 20a whose height was 3 μm, and a second convex pattern (21b) in which the pitch t2 of the convexities 20b was 15 μm, the top size s2 of each convexity 20b was 10 μm, the height h of each convexity 20b was 3 μm, and the distance d2 between adjacent ones of the convexities 20b was 5 μm. Thus, a convex pattern layer 17 illustrated in FIG. 6D was obtained. The average distance D between the first convex pattern and the second convex pattern was 11 μm. Subsequently, in accordance with the process of forming a scintillator layer 18 employed in Examples 1 to 4, CsI was deposited over the convexities 20, and the substrate 10 was cooled to room temperature or below. When the scintillator layer 18 was observed through a scanning electron microscope (SEM, S-5500 manufactured by Hitachi), no crack was observed in a portion of the scintillator layer 18 coinciding with the boundary 12 between adjacent ones of the pixels, i.e., the gap between the first convex pattern and the second convex pattern. Moreover, peeling occurred partially in a portion of the scintillator layer 18 coinciding with the first convex pattern 21a because of the stress applied to the scintillator layer 18 when the substrate 10 was cooled. Hence, the MTF was not improved in Comparative Example 2, unlike the cases in Examples 1 to 4.

COMPARATIVE EXAMPLE 3

Figure 6E:
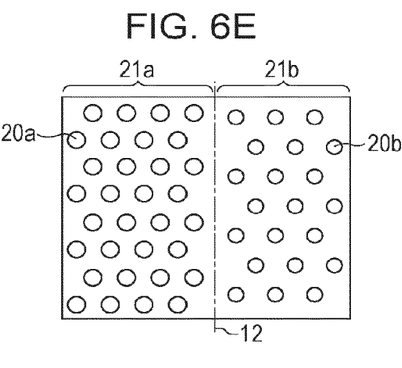

In accordance with the process employed in Examples 1 to 4, there were formed a first convex pattern (21a) in which the pitch t1 of the convexities 20a was 7.5 μm, the top size s1 of each convexity 20a was 4 μm, the height h of each convexity 20a was 3 μm, and the distance d1 between adjacent ones of the convexities 20a was 3.5 μm; and a second convex pattern (21b) in which the pitch t2 of the convexities 20 was 10 μm, the top size s2 of each convexity 20b was 3 μm, the height h of each convexity 20b was 3 μm, and the distance d2 between adjacent ones of the convexities 20b was 6 μm. Thus, a convex pattern layer 17 illustrated in FIG. 6E was obtained. The average distance D between the first convex pattern and the second convex pattern was 9.6 μm. Subsequently, in accordance with the process of forming a scintillator layer 18 employed in Examples 1 to 4, CsI was deposited over the convexities 20, and the substrate 10 was cooled to room temperature or below. When the scintillator layer 18 was observed through a scanning electron microscope (SEM, S-5500 manufactured by Hitachi), no crack was observed in a portion of the scintillator layer 18 coinciding with the boundary 12 between adjacent ones of the pixels, i.e., the gap between the first convex pattern and the second convex pattern. Meanwhile, cracks were observed partially in portions of the scintillator layer 18 coinciding with the first convex pattern (21a) and the second convex pattern (21b). Hence, the MTF was not improved in Comparative Example 3, unlike the cases in Examples 1 to 4.

In Comparative Example 3, the ratio of the top size s of each convexity 20 to the pitch t of the convexities 20 was smaller than 0.6. Therefore, the portion of the scintillator layer 18 coinciding with the gap between adjacent ones of the convexities 20 in each convex pattern 21 was more vulnerable to the stress applied during the cooling step than the portion of the scintillator layer 18 coinciding with the gap between the first convex pattern (21a) and the second convex pattern (21b). Consequently, cracks were liable to be formed in the portions of the scintillator layer 18 coinciding with the convex patterns 21. Thus, in Comparative Example 3, cracks were formed in portions of the scintillator layer 18 coinciding with individual pixels (individual convex patterns 21), resulting in failure in crack formation at the boundary 12 between adjacent ones of the pixels (the gap between adjacent ones of the convex patterns 21). Accordingly, improvement in the MTF with crack formation was not realized.

In Comparative Example 3, the ratio of the top size s of each convexity 20 to the pitch t of the convexities 20 was smaller than 0.6 for both the first convex pattern and the second convex pattern. When the ratio of the top size s of each convexity 20 to the pitch t of the convexities 20 was smaller than 0.6 for one of the first and second convex patterns, crack formation failed at the boundary 12 between adjacent ones of the pixels, either.

COMPARATIVE EXAMPLE 4

Figure 6F:
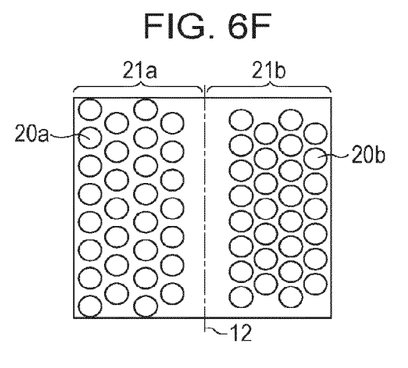

In accordance with the process employed in Examples 1 to 4, there were formed a first convex pattern (21a) in which the pitch t1 of the convexities 20a was 10 µm, the top size s1 of each convexity 20a was 6 µm, the height h of each convexity 20a was 3 µm, and the distance d1 between adjacent ones of the convexities 20a was 4 µm; and a second convex pattern (21b) in which the pitch t2 of the convexities 20b was 7.5 µm, the top size s2 of each convexity 20b was 6 µm, the height h of each convexity 20b was 3 µm, and the distance d2 between adjacent ones of the convexities 20b was 1.5 µm. Thus, a convex pattern layer 17 illustrated in FIG. 6F was obtained. The average distance D between the first convex pattern and the second convex pattern was 14.6 µm. Subsequently, in accordance with the process of forming a scintillator layer 18 employed in Examples 1 to 4, CsI was deposited over the convexities 20, and the substrate 10 was cooled to room temperature or below. When the scintillator layer 18 was observed through a scanning electron microscope (SEM, S-5500 manufactured by Hitachi), no crack was observed in a portion of the scintillator layer 18 coinciding with the boundary 12 between adjacent ones of the pixels, i.e., the gap between the first convex pattern and the second convex pattern. Accordingly, the MTF was not improved in Comparative Example 4, unlike the cases in Examples 1 to 4.

That is, even if the ratio of the top size s of each convexity 20 to the pitch t of the convexities 20 was 0.6 or larger and smaller than 0.9 for both the first convex pattern (21a) and the second convex pattern (21b) as in Comparative Example 4, the average distance D between the adjacent convex patterns 21 and the height h of each convexity 20 did not satisfy the condition D<4.6h. Therefore, the scintillator layer 18 grew (was deposited) also at the gap between adjacent ones of the convex patterns 21. Consequently, the stress applied to the portion of the scintillator layer 18 coinciding with the gap between adjacent ones of the convex patterns 21 was insufficient, resulting in failure in crack formation.

In Comparative Example 4, since crack formation failed at the boundary 12 between adjacent ones of the pixels, improvement in the MTF with crack formation was not realized.

COMPARATIVE EXAMPLE 5

In accordance with the process employed in Examples 1 to 4, there were formed a first convex pattern (21a) in which the pitch t1 of the convexities 20a was 12.5 µm, the top size s1 of each convexity 20a was 9 µm, the height h of each convexity 20a was 3 µm, and the distance d1 between adjacent ones of the convexities 20a was 3.5 µm; and a second convex pattern (21b) in which the pitch t2 of the convexities 20b was 12.5 µm, the top size s2 of each convexity 20b was 7 µm, the height h of each convexity 20b was 3 µm, and the distance d2 between adjacent ones of the convexities 20b was 5.5 µm. The average distance D between the first convex pattern and the second convex pattern was 16.6 µm. Subsequently, in accordance with the process of forming a scintillator layer 18 employed in Examples 1 to 4, CsI was deposited over the convexities 20, and the substrate 10 was cooled to room temperature or below. When the scintillator layer 18 was observed through a scanning electron microscope (SEM, S-5500 manufactured by Hitachi), no crack was observed in a portion of the scintillator layer 18 coinciding with the boundary 12 between adjacent ones of the pixels, i.e., the gap between the first convex pattern and the second convex pattern. Accordingly, the MTF was not improved in Comparative Example 5, unlike the cases in Examples 1 to 4.

In Comparative Example 5 also, the stress applied to the portion of the scintillator layer 18 coinciding with the gap between adjacent ones of the convex patterns 21 was insufficient, as in Comparative Example 4, resulting in failure in crack formation.

In Comparative Example 5, since crack formation failed at the boundary 12 between adjacent ones of the pixels, improvement in the MTF with crack formation was not realized.

COMPARATIVE EXAMPLE 6

In accordance with the process employed in Examples 1 to 4, there were formed a first convex pattern (21a) in which the pitch t1 of the convexities 20a was 15 µm, the top size s1 of each convexity 20a was 10 µm, the height h of each convexity 20a was 3 µm, and the distance d1 between adjacent ones of the convexities 20a was 5 µm; and a second convex pattern (21b) in which the pitch t2 of the convexities 20b was 10 µm, the top size s2 of each convexity 20b was 7.5 µm, the height h of each convexity 20b was 3 µm, and the distance d2 between adjacent ones of the convexities 20b was 2.5 µm. The average distance D between the first convex pattern and the second convex pattern was 16.6 µm. Subsequently, in accordance with the process of forming a scintillator layer 18 employed in Examples 1 to 4, CsI was deposited over the convexities 20, and the substrate 10 was cooled to room temperature or below. In Comparative Example 6 also, the stress applied to the portion of the scintillator layer 18 coinciding with the gap between adjacent ones of the convex patterns 21 was insufficient, as in Comparative Examples 4 and 5, resulting in failure in crack formation.

In Comparative Example 6, since crack formation failed at the boundary 12 between adjacent ones of the pixels, improvement in the MTF with crack formation was not realized.

EXAMPLE 5

Titanium oxide powder was provided on the scintillator layer 18 having the crack formed in Example 1, whereby the crack formed in the portion of the scintillator layer 18 coinciding with the gap between adjacent ones of the convex patterns 21 was filled with the titanium oxide powder.

In Example 5, the separation between adjacent ones of the pixels was enhanced with the crack as in Examples 1 to 4. Furthermore, filling the crack with the titanium oxide powder caused light to diffuse in the crack. This further reduced crosstalk among pixels. Consequently, the MTF was improved.

EXAMPLE 6

A reflective film made of Al was provided over the scintillator layer 18 having the crack formed in Example 2. Specifically, an Al film was deposited with a thickness of 50 nm on the scintillator layer 18 including the portion having the crack and coinciding with the gap between adjacent ones of the convex patterns 21.

In Example 6, the separation between adjacent ones of the pixels was enhanced with the crack as in Examples 1 to 5. Furthermore, the Al film as a reflective film covering the crack reflected light. This further reduced crosstalk among pixels. Consequently, the MTF was improved.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-085804 filed Apr. 7, 2011, which is hereby incorporated by reference herein in its entirety.

What is claimed is:

1. A method of manufacturing a radiation detecting device including a plurality of photodetectors and a scintillator layer provided above the plurality of photodetectors, the method comprising:
   forming a scintillator layer on a substrate carrying a plurality of photodetectors and a plurality of convex patterns each including a plurality of convexities, the plurality of convex patterns coinciding with the respective photodetectors in a stacking direction, the scintillator layer being formed in such a manner as to extend over the plurality of convex patterns; and
   forming a crack in a portion of the scintillator layer that coincides, in the stacking direction, with a gap between adjacent ones of the convex patterns by cooling the substrate carrying the scintillator layer,
   wherein the plurality of convex patterns satisfy the following conditions:

$0.6 \leq s/t < 0.9$ $d < D < 4.6h$ where t denotes a pitch of the convexities in each convex pattern, s denotes a length of an area of each convexity that is in contact with the scintillator layer in each convex pattern, h denotes a height of each convexity in each convex pattern, d denotes a distance between adjacent ones of the convexities in each convex pattern, and D denotes an average distance between adjacent ones of the convex patterns.

2. The method of manufacturing a radiation detecting device according to claim 1, wherein the pitch t is 1 μm or larger and 15 μm or smaller.

3. The method of manufacturing a radiation detecting device according to claim 1, wherein the convexities in each convex pattern are in a honeycomb arrangement.

4. The method of manufacturing a radiation detecting device according to claim 1 further comprising filling the crack with a member that diffuses light.

5. The method of manufacturing a radiation detecting device according to claim 1 further comprising covering the crack with a member that reflects light.

6. A method of manufacturing a radiation detecting device including a plurality of photodetectors and a scintillator layer provided above the plurality of photodetectors, the method comprising:
   forming a scintillator layer on a substrate carrying a plurality of convex patterns each including a plurality of convexities such that the scintillator layer extends over the plurality of convex patterns;
   forming a crack in a portion of the scintillator layer that coincides, in a stacking direction, with a gap between adjacent ones of the convex patterns by cooling the substrate carrying the scintillator layer; and
   arranging the substrate carrying the scintillator layer having the crack such that the substrate face a plurality of photodetectors and the crack coincides with a gap between adjacent ones of the photodetectors,
   wherein the plurality of convex patterns satisfy the following conditions:

$0.6 \leq s/t < 0.9$ $d < D < 4.6h$ where t denotes a pitch of the convexities in each convex pattern, s denotes a length of an area of each convexity that is in contact with the scintillator layer in each convex pattern, h denotes a height of each convexity in each convex pattern, d denotes a distance between adjacent ones of the convexities in each convex pattern, and D denotes an average distance between adjacent ones of the convex patterns.

7. A radiation detecting device comprising:
   a plurality of photodetectors;
   a plurality of convex patterns each including a plurality of convexities; and
   a scintillator layer extending over the plurality of convex patterns,
   wherein the plurality of convex patterns coincide with the respective photodetectors in a stacking direction,
   wherein the scintillator layer has a crack in a portion thereof that coincides, in a stacking direction, with a gap between adjacent ones of the convex patterns, and
   wherein the radiation detecting device satisfies the following conditions:

$0.6 \leq s/t < 0.9$ $d < D < 4.6h$ where t denotes a pitch of the convexities in each convex pattern, s denotes a length of an area of each convexity that is in contact with the scintillator layer in each convex pattern, h denotes a height of each convexity in each convex pattern, d denotes a distance between adjacent ones of the convexities in each convex pattern, and D denotes an average distance between adjacent ones of the convex patterns.

\* \* \* \* \*